United States Patent
Liang et al.

(10) Patent No.: US 7,522,010 B2
(45) Date of Patent: Apr. 21, 2009

(54) ULTRA-LOW POWER CRYSTAL OSCILLATOR

(75) Inventors: Kevin YiKai Liang, Cupertino, CA (US); Arvind Bomdica, Fremont, CA (US); Min Xu, Mountain View, CA (US); Ming So, Danville, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 70 days.

(21) Appl. No.: 11/797,081

(22) Filed: Apr. 30, 2007

(65) Prior Publication Data

US 2008/0266009 A1 Oct. 30, 2008

(51) Int. Cl.
*H03C 1/00* (2006.01)
(52) U.S. Cl. .................... 331/185; 331/176; 331/182
(58) Field of Classification Search ............... 341/74, 341/76, 57, 182, 185, 158, 116 FE, 184, 176
See application file for complete search history.

(56) References Cited

U.S. PATENT DOCUMENTS

| 5,568,093 | A  | * | 10/1996 | Holzer ........................ 330/264 |
| 5,677,649 | A  | * | 10/1997 | Martin ......................... 331/57 |
| 6,320,473 | B1 | * | 11/2001 | Leuschner ............ 331/116 FE |
| 6,784,757 | B2 | * | 8/2004 | Sibrai et al. .................. 331/182 |
| 6,798,301 | B1 | * | 9/2004 | Balan et al. ..................... 331/74 |
| 2002/0017959 | A1 | * | 2/2002 | Kanazawa et al. ............ 331/76 |

* cited by examiner

*Primary Examiner*—Jean B Jeanglaude
(74) *Attorney, Agent, or Firm*—Sterne, Kessler, Goldstein & Fox P.L.L.C.

(57) ABSTRACT

An ultra-low power crystal oscillator architecture that draws less than 2 μA during steady state operation. An amplifier stage is self biased and has input and output clamp circuits that limit its signal swing. Circuit values are selected such that there is sufficient transient load current for the first amplifier stage to oscillate, while at the same time the input and output clamp circuits maintain a sufficiently low swing of the stage such that the steady state average load current is on the order of less than 1 μA.

18 Claims, 3 Drawing Sheets

ULTRA-LOW POWER CRYSTAL OSCILLATOR

BACKGROUND

The inventions described herein relate to crystal oscillators. Although basic crystal oscillator arrangements are known, there is an unfilled need for an ultra-low power crystal oscillator, particularly for applications in battery-powered equipment to prolong battery life. For example, in personal computers, chip sets performing the function of a real time clock (RTC) must run on battery power when the computer is shut off and unplugged from a power outlet. It is desirable that a RTC chip set be able to operate for at least seven years on a factory-installed battery. For this purpose, a RTC chip set should consume less than 2 µA of current when running on battery power. When running on battery power, most of the power consumed by a RTC is consumed by its crystal oscillator. Typically, a crystal oscillator for a RTC operates at a rate of about 32 KHz and has a substantial "swing" which causes the oscillator to consume a significant amount of power. Various circuit arrangements of low power crystal oscillator circuits have been attempted. However, typically, they draw 6 µA amps or more of current making them unacceptable for many applications.

What is needed, therefore, is a crystal oscillator for a RTC chip set that consumes less power than a typical RTC so that devices that are battery powered can operate a substantial amount of time without the need to replace a battery.

SUMMARY

This section is for the purpose of summarizing some aspects of the inventions described more fully in other sections of this patent document. It briefly introduces some preferred embodiments. Simplifications and omissions are made to avoid obscuring the purpose of the section. Such simplifications or omissions are not intended to limit the scope of the claimed inventions.

The inventions described and claimed herein relate to circuit arrangements for an ultra-low power crystal oscillator. A common theme of the circuit arrangements presented is that they utilize input and output clamp circuits and a self-biased amplifier circuit to achieve ultra-low power operation by limiting oscillator swing. Circuit parameters are selected such that there is ample transient power to allow the circuit to oscillate while at the same time consuming ultra-low power during steady state operation.

BRIEF DESCRIPTION OF THE DRAWINGS/FIGURES

These and other features, aspects, and advantages of the present invention will become better understood with regard to the following description, appended claims, and accompanying drawings where:

DETAILED DESCRIPTION

The following describes particular circuit arrangements for an ultra low power crystal oscillator. In the following description, numerous specific details are set forth in order to provide a thorough understanding of the present invention. However, it will be apparent to those skilled in the art to which the inventions pertain that the inventions described herein may be practiced without these specific details. The descriptions and representations herein are the common means used by those experienced or skilled in the art to most effectively convey the substance of their work to others skilled in the art. In other instances, well-known methods, procedures, components, and circuitry have not been described in detail to avoid unnecessarily obscuring aspects of the present invention.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments. Further, the order of blocks in process flowcharts or diagrams representing one or more embodiments of the invention do not inherently indicate any particular order nor imply any limitations in the invention.

Embodiments of the inventions are discussed herein with reference to FIGS. 1-4. However, those skilled in the art will readily appreciate that the detailed description given herein with respect to these figures is for explanatory purposes as the inventions extend beyond these limited embodiments.

Figure 1:
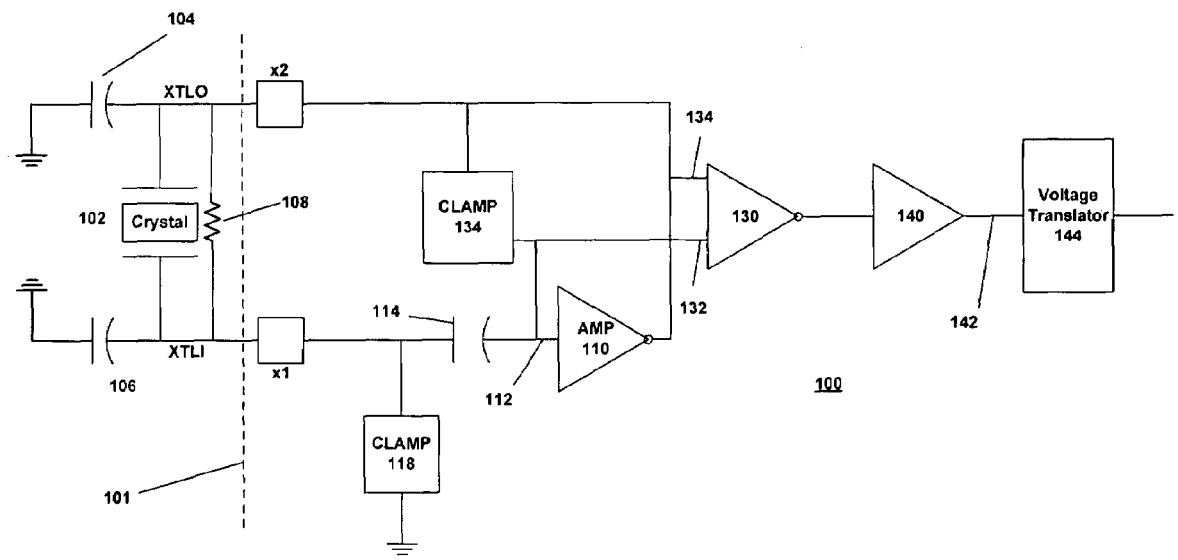
FIG. 1 is a schematic diagram of real time clock (RTC) oscillator circuit according to the inventions.

FIG. 1 is a schematic diagram showing an embodiment of a RTC crystal oscillator architecture according to the inventions. The oscillator is generally indicated by reference numeral 100. Dashed line 101 represents the demarcation between a circuit board and a chip installed on the circuit board. Components to the left of line 101 are on the board and components to the right of line 101 are on the chip. The frequency of the oscillator is determined by a crystal 102 and a pair of load capacitors 104 and 106 that couple respective sides of crystal 102 to circuit ground. Typically capacitors 104 and 106 have a value in a range of 12 pf to 20 pf. The value of these capacitors should be based on recommendations of the manufacturer of whatever crystal 102 is selected. An optional load resistor 108 is coupled between crystal input and output, XTLI and XTLO, respectively.

Pad X1 is clamped to the ground by a clamp circuit 118 and then AC coupled through a capacitor 114 to the input 112 of a first stage amplifier 110. Clamp circuit 118 limits the swing of crystal 102. The first stage amplifier 110 provides a gain of greater than 1 at substantially 180 degrees phase shift with respect to its input. The output of amplifier 110 is connected to the crystal XTLO through pad X2. Pad X2 is also clamped to limit the swing of crystal 102. A second stage amplifier 130 further amplifies the differential signals to a full swing clock signal. The full swing clock signal can be buffered and translate to a desired RTC supply voltage to provides the 32 KHz clock to the RTC units. In this circuit arrangement, the majority of the current consumed by oscillator 100 is consumed by the first stage amplifier 110 and the second stage amplifier 130 (especially 110).

Figure 2:
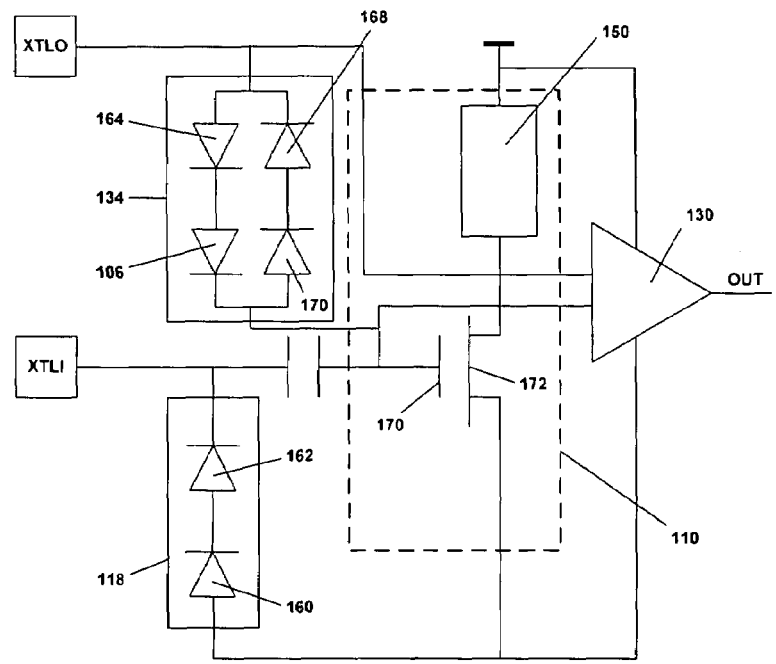
FIG. 2 is a detailed schematic diagram of an RTC oscillator circuit according to the inventions.

FIG. 2 is a more detailed schematic diagram of the ultra-low power crystal oscillator according to the inventions. FIG.

2 shows simple implementations of clamping circuits 118 and 134 and one embodiment of amplifier 110. Input clamp circuit 118 is shown in FIG. 2 as a series pair of diodes 160 and 162. However, in alternate embodiments, clamp circuit 118 can be fabricated from either PN junction diodes, diode connected NMOS transistors or diode connected MOS transistors (see FIGS. 3 and 4).

Output clamp circuit 134 includes a first series connected pair of diodes 164 and 166 and a second pair of series connected diodes 168 and 169. Again, in alternate embodiments, clamp circuit 134 can be fabricated from either PN junction diodes, diode connected NMOS transistors or diode connected PMOS transistors. The two pairs of series connected diodes are connected in parallel with one another and with opposite polarity.

Input clamp 118 limits the swing of XTLI and the output clamp 134 limits the swing of XTLO around XTLI. Input clamp circuit 118 limits the crystal input swing above ground to less than a voltage drop across two diodes. This reduces power needed to charge and discharge input load capacitor 104 and 106. Input clamp circuit 118 also maintains common mode voltage of the input XTLI to about the drop of one diode above ground. AC coupling capacitor 114 blocks DC voltage to the gate 170 of a transistor 172 in amplifier 110. Only the AC component of the crystal input XTLI will be coupled to gate 170. Output clamp circuit 134 limits the swing of voltage at XTLO to less than plus or minus the drop of the diodes. This helps to maintain the common mode voltage of gate 170. Amplifier 110 is a self-biased amplifier which includes a self-biased load resistor 150. It provides the required 180 degrees phase shift and voltage gain to produce oscillations with the crystal. The self-biased load resistor 150 removes the need for a biased generation circuit that would otherwise be required. Such circuits normally require constant current consumption. By eliminating this requirement, power consumption is significantly reduced. A large resistance is selected to reduce amplifier current and power consumption.

By carefully selecting values of components of the input clamp circuit 118 and the output clamp circuit 134, amplifier 110 is self-biased at just above the sub-threshold voltage to achieve low current consumption of approximately 1 μA. Second stage differential amplifier 130 also has self-biased resistor loads. The differential pair is designed to work just out of sub-threshold voltage and generate full swing signals without consuming much current (hundreds of nA).

Figure 3:
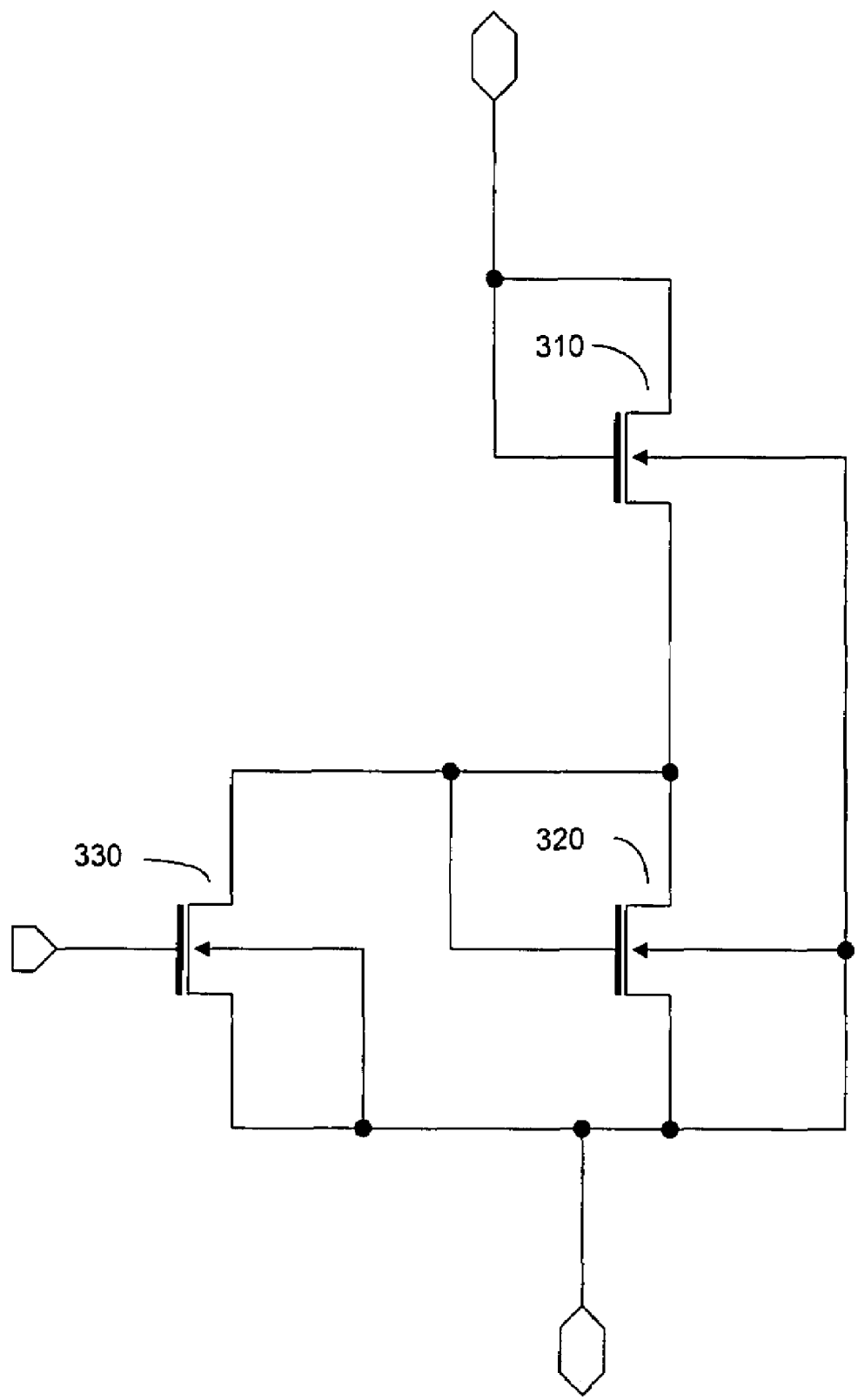
FIG. 3 is a schematic diagram of an NMOS implementation of clamp circuit 118.
Figure 4:
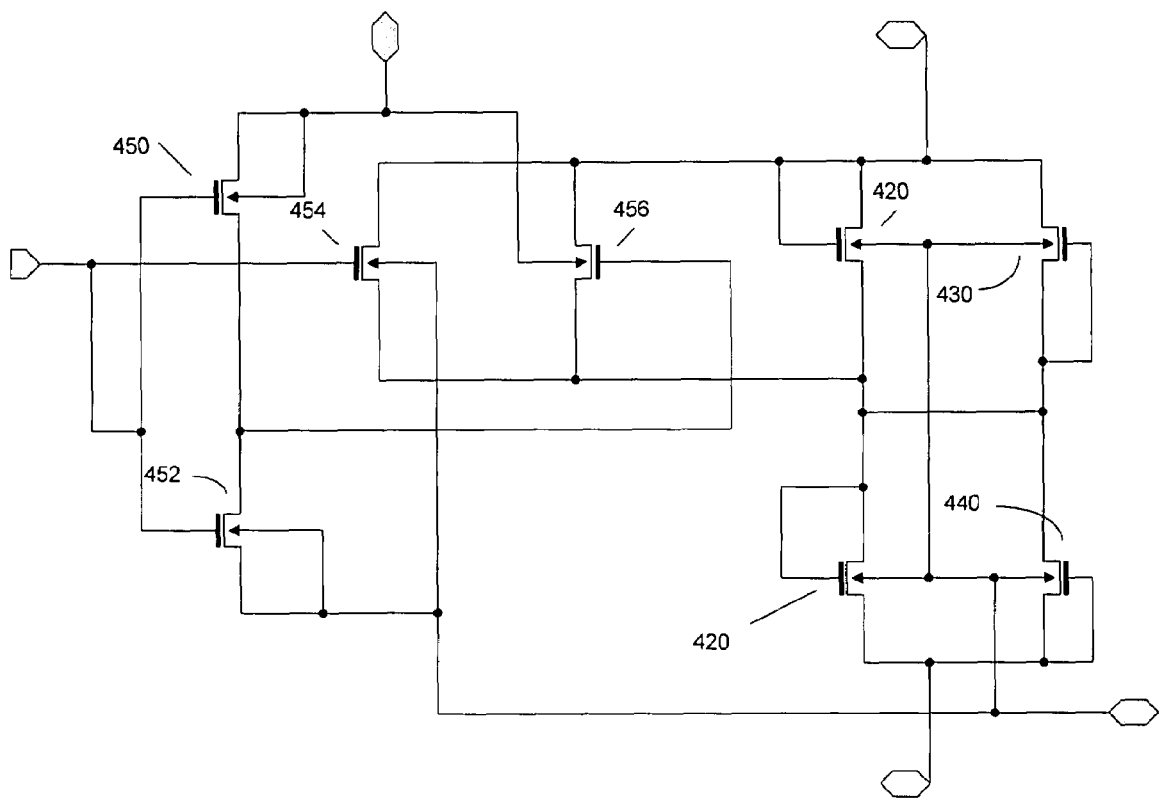
FIG. 4 is a schematic diagram of a PMOS implementation of clamp circuit 134.

Clamp 118 is constructed and arranged to limit the swing of crystal 102. Although the FIG. 2 embodiment shows a two diode arrangement, alternatives can also be used (FIGS. 3 and 4 are two such examples). Depending upon diode characteristics and process, oscillator 100 can utilize any number of diode or diode equivalents for either of claim circuits 118 and 134, as long as they provide sufficient swing. Clamp 134 is shown in the FIG. 2 embodiment as two back to back pairs of diodes. Clamp 134 is constructed and arranged to limit the swing of crystal 102 to a drop equivalent to that of two diodes around the signal of gate 170. Any or all of the diodes of clamp 134 can be implemented in NMOS as shown in FIG. 3 or PMOS as shown in FIG. 4. The number of diodes is not limited to two or pairs of two as shown in FIG. 2. Rather, one can use 1, 2 or even more. It is a matter of design choice. The design constraint is that clamps 118 and 134 be constructed and arranged such that the signal swing of crystal 102 is limited and the overall power of the oscillator is thereby reduced.

The first stage amplifier includes the load resistor 150. Load resistor 150, acting with NMOS transistor 172 limits the constant current of the amplifier stage. NMOS transistor provides a transient response to the crystal 102. The power consumed by this first stage is limited to 800 na to 1200 na.

The second stage amplifier 130 has values selected such that it is carefully designed around the voltage swing of XTLO and the XTLI (gate 170 of transistor 172). The amplifier must have sufficient gain to amplify the differential signals of XTLO and the XTLI (at the gate 170 of transistor 172) while at the same time consuming limited current (200 na~500 na).

A significant design feature of the ultra low power crystal oscillator according to the inventions is the use of clamps 118 and 134 in conjunction with a self-biased load resistor 150 to limit the swing of crystal 102 so that little current is consumed during steady state operation of the oscillator. The first stage amplifier can and should draw a significant transient power in order to oscillate, but then draw very limited average power in order to keep overall power consumption low. Practical embodiments of the ultra low power crystal oscillator have a load current of less than 1 μA even though transient load current may be 100 μA or more. First stage amplifier 110 can be constructed as a simple transistor amplifier or any suitable off the shelf amplifier suitable for this purpose can be used. Similarly, second stage amplifier 130 can be constructed as a simple transistor amplifier or any suitable off the shelf amplifier suitable for this purpose can be used.

FIG. 3 is a schematic diagram of a NMOS implementation of clamp circuit 118. The NMOS configuration of diodes is an alternative embodiment of a diode pair shown in the FIG. 2 implementation of clamp circuit 118. In this alternative embodiment, the diode pair is implemented by a pair of diodes-connected NMOS transistors 310 and 320. NMOS transistor 330 is configured to operate as a switch. By switching device 330, the circuit can be "tuned down" to a single diode equivalent. This can be helpful in adjusting the swing of the oscillator to a desired level so that oscillation can be maintained while consuming ultra-low power steady state. As another alternative embodiment, the diodes of claim circuit 118 can be implemented as PN junction diodes and as diodes connected PMOS transistors.

FIG. 4 is a schematic diagram of a NMOS implementation of clamp circuit 134. The NMOS configuration of diodes is an alternative embodiment of the diode pairs shown in the FIG. 2 implementation of claim circuit 134. Diode pairs 410, 420 and 430, 440 are diodes-connected NMOS transistors constituting back to back diode pairs functionally equivalent to the back to back diode pairs shown in the FIG. 2 embodiment of clamp circuit 134. NMOS transistors 450, 452, 454 and 456 are configured to provide switching for NMOS transistors 410, 420, 430 and 440 so that they can be "tuned down" to become equivalent to single diodes. As with clamp circuit 118, this can be helpful in adjusting the swing of the oscillator to a desired level so that oscillation can be maintained while consuming ultra-low power steady state. As another alternative embodiment, the diodes of claim circuit 134 can be implemented as PN junction diodes and as diodes connected PMOS transistors.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described in sufficient details with a certain degree of particularity. It is understood to those skilled in the art that the present disclosure of embodiments has been made by way of examples only and that numerous changes in the arrangement and combination of parts may be resorted without departing from the spirit and scope of the invention as claimed. Accordingly, the scope of the present invention is defined by the appended claims rather than the foregoing description of embodiments.

What is claimed is:

1. An oscillator circuit comprising:
   a first self-biased amplifier having an input constructed and arranged to be coupled to a first side of a crystal and an output constructed and arranged to be coupled to a second side of the crystal;
   a first clamp coupled to the input of the first amplifier and to ground; and
   a second clamp constructed and arranged to be coupled between the input of the first amplifier and a second side of the crystal, the first and second clamps limiting the swing of the crystal thereby effectively limiting the amount of power consumed by the oscillator circuit.

2. An oscillator circuit according to claim 1, further comprising:
   a second differential amplifier for amplifying a signal from the first amplifier.

3. An oscillator circuit according to claim 2, further including a voltage translator coupled to the output of the second amplifier.

4. An amplifier according to claim 1, wherein the first clamp comprises a pair of series connected diodes.

5. An oscillator circuit according to claim 1, wherein the second clamp comprises two pairs of series connected diodes, each pair being connected with a polarity opposite the other pair.

6. An oscillator circuit according to claim 1, wherein the first clamp comprises one of: one or more diode connected NMOS transistors and one or more diode connected PMOS transistors.

7. An oscillator circuit according to claim 6, wherein the first clamp further comprises switches that allow the number of diode equivalents of the first clamp to be externally controlled.

8. An oscillator circuit according to claim 1, wherein the second clamp comprises one of: one or more diode connected NMOS transistors and one or more diode connected PMOS transistors.

9. An oscillator circuit according to claim 8, wherein the second clamp further comprises switches that allow the number of diode equivalents of the second clamp to be externally controlled.

10. An oscillator circuit according to claim 1, wherein the first amplifier comprises a transistor and a self-biased load resistor.

11. An oscillator circuit according to claim 10, wherein the average load current of the first amplifier is less than 1 μA.

12. An oscillator circuit according to claim 10, wherein the transient load current of the first amplifier is 100 μA or more.

13. An oscillator circuit according to claim 12, wherein the transient load current of the first amplifier is large enough to allow the oscillator circuit to oscillate.

14. The oscillator circuit of claim 1, further comprising a crystal with a first side of the crystal coupled to the first self-biased amplifier and a second side of the crystal coupled to the output.

15. A method for limiting power consumption in an oscillator circuit, comprising:
   clamping respective sides of a crystal to limit swings thereof; and
   providing self-biased amplification to the clamped crystal to produce an amplified output signal,
   wherein the clamping effectively limits an amount of power consumed by the oscillator circuit.

16. The method according to claim 15, wherein the clamping occurs in accordance with predetermined characteristics.

17. The method according to claim 15, wherein the swings are voltage swings.

18. The method according to claim 15, wherein the amplified output signal has a phase shift of about 180 degrees.

* * * * *